(12) United States Patent
Kam et al.

(10) Patent No.: US 8,896,078 B2
(45) Date of Patent: Nov. 25, 2014

(54) LIGHT EMITTING APPARATUS

(71) Applicants: Samsung Electronics Co., Ltd, Suwon-si, Gyeonggi-do (KR); Korea Photonics Technology Institute, Gwangju (KR)

(72) Inventors: Dong Hyuck Kam, Gyeonggi-do (KR); Seong Deok Hwang, Seoul (KR); Jae Pil Kim, Gwangju (KR); Sang Bin Song, Gwangju (KR); Wan Ho Kim, Gwangju (KR); Sie Wook Jeon, Gwangju (KR)

(73) Assignees: Samsung Electronics Co., Ltd., Suwon-si (KR); Korea Photonics Technology Institute, Gwangju (KR)

( * ) Notice: Subject to any disclaimer, the term of this patent is extended or adjusted under 35 U.S.C. 154(b) by 0 days.

(21) Appl. No.: 13/785,152

(22) Filed: Mar. 5, 2013

(65) Prior Publication Data

US 2013/0234274 A1   Sep. 12, 2013

(30) Foreign Application Priority Data

Mar. 6, 2012  (KR) .................. 10-2012-0022899

(51) Int. Cl.
 *H01L 33/58* (2010.01)
 *H01L 33/48* (2010.01)
(52) U.S. Cl.
 CPC .............. *H01L 33/58* (2013.01); *H01L 33/486* (2013.01); *H01L 2224/48091* (2013.01)
 USPC ............ 257/432; 257/433; 257/666; 257/95; 257/99

(58) Field of Classification Search
 USPC .................. 257/95–99, 432–433, 666
 See application file for complete search history.

(56) References Cited

U.S. PATENT DOCUMENTS

| | | | |
|---|---|---|---|
| 7,081,278 B2 | 7/2006 | Lipson et al. | |
| 7,906,794 B2* | 3/2011 | Harrah et al. | 257/99 |
| 8,610,138 B2* | 12/2013 | Lee et al. | 257/88 |
| 2005/0230691 A1* | 10/2005 | Amiotti et al. | 257/79 |
| 2007/0235743 A1* | 10/2007 | Lee et al. | 257/81 |
| 2012/0061717 A1* | 3/2012 | Lee et al. | 257/99 |
| 2012/0091493 A1* | 4/2012 | Lin et al. | 257/98 |

FOREIGN PATENT DOCUMENTS

| | | |
|---|---|---|
| JP | 2007-317816 | 12/2007 |
| KR | 10-0587016 | 5/2006 |
| KR | 10-0870639 | 4/2008 |
| KR | 2010-0093949 | 8/2010 |

* cited by examiner

*Primary Examiner* — David Vu
*Assistant Examiner* — Jonathan Han
(74) *Attorney, Agent, or Firm* — Ellsworth IP Group PLLC

(57) ABSTRACT

There is provided a light emitting apparatus including: at least one pair of lead frames; a light emitting device electrically connected to the lead frames to emit ultraviolet rays; a body including a side wall surrounding the light emitting device, and a groove portion formed in an upper surface of the side wall to receive an adhesive; and a lens part disposed above the light emitting device and fixed to the upper surface of the side wall of the body by the adhesive.

16 Claims, 3 Drawing Sheets

LIGHT EMITTING APPARATUS

CROSS-REFERENCE TO RELATED APPLICATIONS

This application claims the priority of Korean Patent Application No. 10-2012-0022899 filed on Mar. 6, 2012, in the Korean Intellectual Property Office, the disclosure of which is incorporated herein by reference in its entirety.

BACKGROUND OF THE INVENTION

1. Field of the Inventive Concept

The present inventive concept relates to a light emitting apparatus with increased strength and reliability.

2. Description of the Related Art

Semiconductor light emitting devices may generate various colors of light through the recombination of electrons and holes at a p-n junction between p-type and n-type semiconductors when current is applied thereto. Light emitting diodes (LEDs) have several advantages, such as a long lifespan, low power consumption, excellent initial driving characteristics, high vibration resistance, and the like, as compared with filament-based light emitting devices, and thus, the demand for such LEDs is continuously increasing. Semiconductor light emitting devices can emit light having various wavelengths, including visible light such as red light, blue light, and the like, infrared rays, and ultraviolet rays, and thus, may be widely applied in the fields of interior illumination, street lighting, medical devices, and the like.

Most light transmissive resin materials widely used as general sealing materials or support members of light emitting devices are easily deteriorated by ultraviolet rays. Therefore, in the case of an ultraviolet (UV) light emitting device emitting light having a wavelength of about 380 nm or shorter, when a general light transmissive resin is used as a material for a package, stable light emissions cannot be obtained due to a decrease in ultraviolet ray transmittance, and when the resin is used as an adhesive material, adhesive strength is decreased due to deterioration thereof due to ultraviolet rays, which may cause a degradation in the reliability of the apparatus.

SUMMARY OF THE INVENTIVE CONCEPT

Exemplary embodiments of the present inventive concept provide a light emitting apparatus having improved reliability.

Additional features and utilities of the present general inventive concept will be set forth in part in the description which follows and, in part, will be obvious from the description, or may be learned by practice of the general inventive concept.

Exemplary embodiments of the present inventive concept provide a light emitting apparatus including: at least one pair of lead frames; a light emitting device electrically connected to the lead frames to emit ultraviolet rays; a body including a side wall surrounding the light emitting device, and a groove portion formed in an upper surface of the side wall to receive an adhesive; and a lens part disposed above the light emitting device and fixed to the upper surface of the side wall of the body by the adhesive.

The light emitting apparatus may further include an ultraviolet light reflecting part formed on a bottom surface of the lens part.

The lens part may be disposed to allow the ultraviolet light reflecting part to cover the groove portion.

The ultraviolet light reflecting part may include at least one of silver (Ag), nickel (Ni), aluminum (Al), rhodium (Rh), palladium (Pd), iridium (Ir), magnesium (Mg), zinc (Zn), platinum (Pt), and gold (Au).

The groove portion may be formed in the upper surface of the side wall as a ring.

The groove portion may be provided in plural.

The body may have a concave portion surrounded by the side wall to expose at least a portion of the lead frames on a bottom surface thereof, and the lens part may be disposed to seal the concave portion.

The groove portion may be formed in the upper surface of the side wall along an outer periphery of the concave portion.

The light emitting apparatus may further include an inert gas filling the concave portion.

The inert gas may include at least one of nitrogen ($N_2$), argon (Ar), and helium (He).

The concave portion may be maintained in a vacuum state.

The side wall may include at least one surface having a slope structure in order to allow light emitted from the light emitting device to be reflected upwardly.

The light emitting apparatus may further include a reflective metal layer formed on at least one surface of the side wall to upwardly reflect the light emitted from the light emitting device.

The body may further include a support part protruded upwardly from the upper surface of the side wall and disposed adjacent to an outer peripheral surface of the lens part.

The support part may be formed integrally with the side wall.

The light emitting apparatus may further include a sub-mount disposed on the lead frames, the light emitting device being disposed on the sub-mount.

Exemplary embodiments of the present inventive concept also provide a light emitting apparatus, including: at least one pair of lead frames; a light emitting device electrically connected to the lead frames to emit ultraviolet rays; a body having a side wall surrounding the light emitting device; and a lens part disposed above the light emitting device and fixed to an upper surface of the side wall of the body by a eutectic alloy.

The light emitting apparatus may further include an ultraviolet light reflecting part formed on a bottom surface of the lens part, and the eutectic alloy may be interposed between the ultraviolet light reflecting part and the upper surface of the side wall.

The eutectic alloy may include gold (Au).

The eutectic alloy may further include at least one of AuZn, AuGe, AuSn, and AuAl.

Exemplary embodiments of the present inventive concept also provide a light emitting apparatus, comprising: at least one pair of lead frames; an LED disposed on at least one of the pair of lead frames; a body having one side connected to the pair of lead frames and extending away from the pair of lead frames and including a conical inner portion extending outwardly while surrounding the LED; and a lens part covering and adhered to at least a portion of a second surface of the body around an external periphery of the conical inner surface at the second surface.

In an exemplary embodiment, the second surface of the body includes a groove portion surrounding the external periphery of the conical inner surface at the second surface such that the lens part is adhered to an adhesive disposed within the groove portion.

In another exemplary embodiment, the lens part includes an ultraviolet light reflecting part formed on one surface thereof, the ultraviolet light reflecting part being adhered to the adhesive disposed within the groove portion.

In yet another exemplary embodiment, a remaining portion of the second surface of the body not covered by the lens part extends upward to contact an outer periphery of the lens part to surround the lens part.

In another still another exemplary embodiment, the lens part includes an ultraviolet light reflecting part formed on one surface thereof, and is adhered to the second surface of the body by a eutectic alloy interposed between the ultraviolet light reflecting part and the second surface of the body around the external periphery of the conical inner surface.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
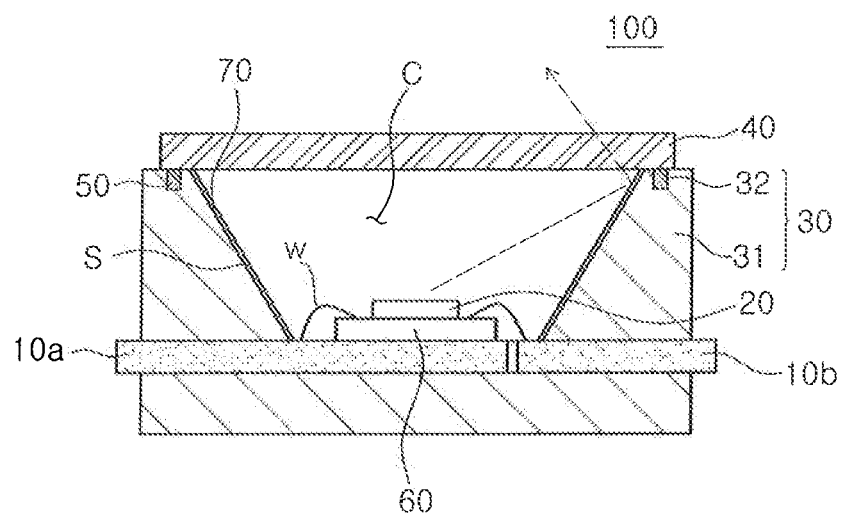
FIG. 1 is a schematic cross-sectional view of a light emitting apparatus according to an embodiment of the present inventive concept.

The embodiments of the present inventive concept will now be described in detail with reference to the accompanying drawings.

The inventive concept may, however, be embodied in many different forms and should not be construed as being limited to the embodiments set forth herein. Rather, these embodiments are provided so that this disclosure will be thorough and complete, and will fully convey the overall inventive concept to those skilled in the art. In the drawings, the shapes and dimensions of elements may be exaggerated for clarity, and the same reference numerals will be used throughout to designate the same or like elements.

FIG. 1 is a schematic cross-sectional view showing a light emitting apparatus according to an embodiment of the present inventive concept.

Referring to FIG. 1, a light emitting apparatus 100 according to this embodiment may include at least one pair of lead frames 10a and 10b; a light emitting device 20 electrically connected to the at least one pair of lead frames 10a and 10b to emit ultraviolet rays; a body 30 surrounding the light emitting device 20; and a lens part 40 disposed above the light emitting device 20.

The body 30 may have a side wall 31 surrounding the light emitting device 20 and a groove portion 32 formed in an upper surface of the side wall 31 to receive an adhesive 50. The lens part 40 may be fixed to the upper surface of the side wall 31 of the body 30 by the adhesive 50.

The pair of lead frames 10a and 10b may be electrically connected to a sub-mount 60, on which the light emitting device 20 is disposed, through conductive wires w, and may function as terminals to apply an external electric signal thereto. To enable this setup, the pair of the lead frames 10a and 10b may be formed of a metal material having excellent electric conductivity.

Specifically, after the light emitting device 20 is mounted on the sub-mount 60 by using a flip-chip bonding or the like, it may be disposed on at least one lead frame 10b. In this case, the light emitting device 20 may be wire-bonded to the lead frames 10a and 10b by the sub-mount 60, so that the light emitting device 20 may receive an electric signal from an external source.

In the present embodiment, at the time of the manufacturing of the light emitting device 20, the sub-mount 60 on which the light emitting device 20 is mounted may be disposed on the lead frames 10a and 10b to thereby simplify the manufacturing process of the light emitting apparatus, and the sub-mount 60 formed of a material having excellent heat conductivity may be used to thereby effectively emit the heat generated from the light emitting device 20 to the outside.

However, the method of mounting the light emitting device 20 is not limited thereto, and the light emitting device 20 may be electrically connected to the lead frames 10a and 10b through various mounting schemes as necessary. For example, the light emitting device 20 may be directly disposed on the pair of lead frames 10a and 10b without the sub-mount 60 to make an electrical connection therebetween through conductive wires w, or the light emitting device 20 may be disposed directly on the lead frames 10a and 10b to make an electrical connection therebetween in a flip-chip bonding manner without the conductive wires w.

The light emitting device 20 may be a UV light emitting device emitting ultraviolet (UV) rays, for example, a UV-LED chip. The ultraviolet rays have a peak wavelength of about 400 nm or less, and may be classified into a UV-A wavelength range having a wavelength range of about 320 nm~400 nm, a UV-B wavelength range having a wavelength range of about 280 nm~320 nm, and a UV-C wavelength range having a wavelength range of about 100 nm~280 nm. A light emitting apparatus including the UV light emitting device 20 may be used for sterilization and purification purposes, according to the wavelength ranges, and may further include a wavelength converting material so as to realize a white light emitting apparatus.

The body 30 may include the side wall 31 surrounding the light emitting device 20 and the groove portion 32 formed in the upper surface of the side wall 31 to receive the adhesive 50. The side wall 31 is formed to surround the light emitting device 20, so that it can serve to reflect the light emitted from the light emitting device 20 upwardly. The material constituting the body 30 is not particularly limited, but the body 30 may be formed of a high-heat resistant resin, metal, ceramic, or the like, that has excellent heat emitting performance and characteristics easily unchanged due to ultraviolet rays.

The body 30 has a concave portion c surrounded by the side wall 31 to expose at least a portion of the lead frames 10a and 10b on a bottom surface thereof. The side wall 31 has a slope structure S within the concave portion C so as to effectively induce the light emitted from the light emitting device 20 upwards (direction being relative with respect to the lead frames 10a and 10b). In the case in which the side wall 31 of the body 30 is formed of a light reflective metal, the side wall 31 may function as a reflecting structure itself.

On the other hand, a reflective metal layer 70 formed of a light reflective metal may be separately formed on a surface of the slope structure S. For example, the reflective metal layer 70 may include a high-reflective material, such as silver (Ag), nickel (Ni), aluminum (Al), rhodium (Rh), palladium (Pd), iridium (Ir), magnesium (Mg), zinc (Zn), platinum (Pt), and gold (Au), or the like, and may be employed in a two or more layered structure to improve reflective efficiency. However, without being limited thereto, various metal materials able to reflect light may be employed.

The groove portion 32 receiving the adhesive 50 may be formed in the upper surface of the side wall 31 of the body 30. The adhesive 50 is provided to fix the lens part 40 to the upper surface of the body 30, and as the adhesive 50 is applied to the groove portion 32, the adhesive 50 is not exposed to or within the concave portion C of the body 30.

In a general type of light emitting apparatus, when a resin based adhesive is applied to the upper surface of the side wall 31 of the body 30 in order to attach the lens part 40 to the body 30, the adhesive is exposed to ultraviolet rays within the concave portion C of the body 30. In this case, such as adhesive may be decomposed by the ultraviolet rays emitted from the light emitting device 20, resulting in separation of the lens part 40 from the body 30, and thus, the kind of adhesive may be limited and reliability of the light emitting apparatus may be degraded.

However, in the present embodiment, the adhesive 50 is applied to the groove portion 32 formed in the upper surface of the side wall 31, to thereby prevent ultraviolet rays emitted from the light emitting device 20 from reacting with the adhesive 50, and thus, the reliability of the light emitting apparatus can be improved.

That is, in the present embodiment, the adhesive 50 to fix the lens part 40 is not directly exposed to the ultraviolet rays, and thus, the types of adhesives thereof are not limited, and the adhesive 50 may be selected from those having sufficient adhesive strength to fix the lens part 40 to the upper surface of the side wall 31 of the body 30. For example, epoxy, silicon, or fluorine-based resin, a metal material, or the like may be used for the adhesive 50, without being limited thereto.

The lens part 40 may be disposed above the light emitting device 20, and may be fixed to the upper surface of the side wall 31 of the body 30 by the adhesive 50. Specifically, the lens part 40 may be disposed to cover the groove portion 32. The lens part 40 may prevent contact between external moisture and oxygen and the light emitting device 20, by sealing the concave portion C of the body 30.

For achieving this, an inside of the concave portion C formed by the side wall 31 of the body 30 may include an inert gas, for example, at least one of nitrogen ($N_2$), argon (Ar), and helium (He), or may be maintained in a vacuum state. However, the present inventive concept is not limited thereto, and the concave portion C may be entirely or partially filled with a resin or the like that is not deteriorated by ultraviolet rays.

The lens part 40 may be formed of a high-heat resistant resin, quartz glass, or the like, that allows the ultraviolet rays to be transmitted and is not deteriorated by the ultraviolet rays. In the present embodiment, the lens part 40 is shown as having a flat shape, but variously shaped lenses, for example, a hemispherical transparent lens may be used to improve light extraction efficiency. The lens part 40 may protect the light emitting device 20 from external elements by completely sealing the concave portion C in which the light emitting device 20 is disposed. Also, the lens part 40 may have a hemispherical, Fresnel, or aspherical lens shape, thereby controlling a light orientation angle or improving light extraction efficiency.

Figure 2:
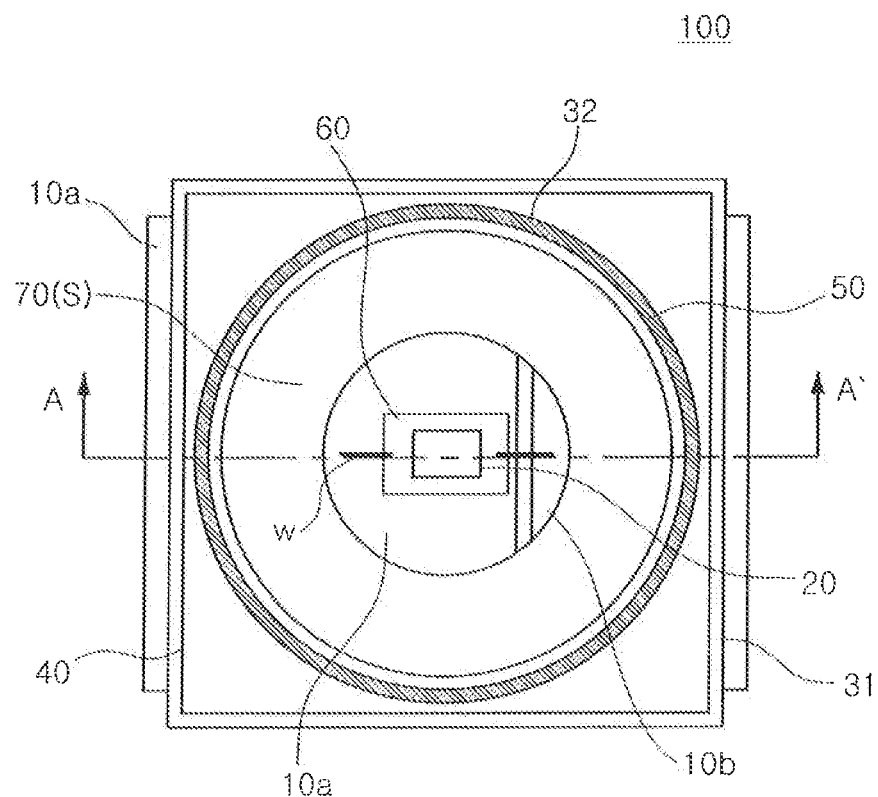
FIG. 2 is a schematic plane view of the light emitting apparatus shown in FIG. 1.

FIG. 2 is a schematic plan view of the light emitting apparatus shown in FIG. 1. Specifically, FIG. 1 schematically shows a cross section of the light emitting apparatus, taken along line A-A' of FIG. 2.

Referring to FIG. 2, the side wall 31 of the body 30 may have the concave portion that surrounds the light emitting device 20 and has a near-circular cross sectional shape. The concave portion C may have a structure in which a width thereof becomes wider toward an upper portion thereof (moving away from the lead frames 10*a* and 10*b*). For achieving this, one surface of the side wall 31, specifically, a surface of the side wall inside which the light emitting device is disposed, may have the slope structure S including a curved surface.

In the present embodiment, the adhesive 50 is received in the groove portion 32, and thus, when viewed from the upper surface of the side wall 31, a region adjacent to the concave portion C may have a flange shape based on the groove portion 32. In addition, as shown in FIG. 2, the groove portion 32 may be formed in a ring shape along the outer periphery of the concave portion in the upper surface of the side wall 31, but is not limited thereto. As necessary, various numbers of groove portions having various shapes may be formed in the upper surface of the side wall 31 of the body 30.

Meanwhile, in the present embodiment, in the case in which the groove portion 32 is formed in a ring shape along the outer periphery of the concave portion C in the upper surface of the side wall 31, the sealing state of the groove portion C can be effectively maintained.

Figure 3:
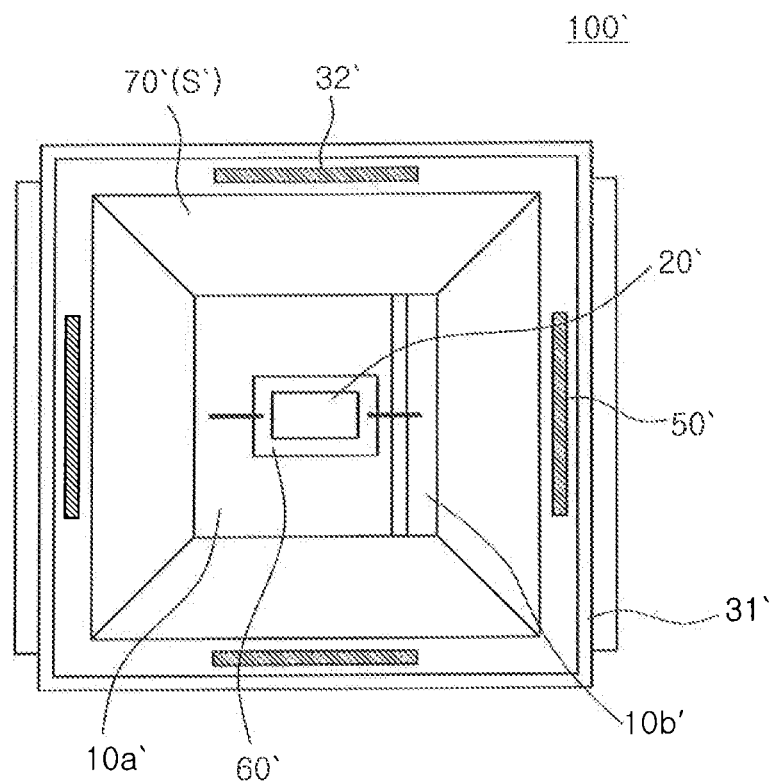
FIG. 3 is a schematic plane view of a light emitting apparatus according to a modification of the embodiment of the present inventive concept.

FIG. 3 is a plane view of a light emitting apparatus according to a modification of the previous embodiment.

Referring to FIG. 3, a side wall 31' surrounding a light emitting device 20' may form a concave portion of which a cross section has a square shape, and one surface of the side wall 31' may have a slope structure S'. That is, the present embodiment is different from the embodiment shown in FIG. 2 in view of the shapes of the side wall 31' and the concave portion, and the position and shape of a groove portion 32' receiving an adhesive 50'. Specifically, a plurality of groove portions 32' may be formed in an upper surface of the side wall 31' of a body 30'. However, as described above, the shape, number, position, and the like of the groove portion 32' may be variously changed as necessary.

Figure 4:
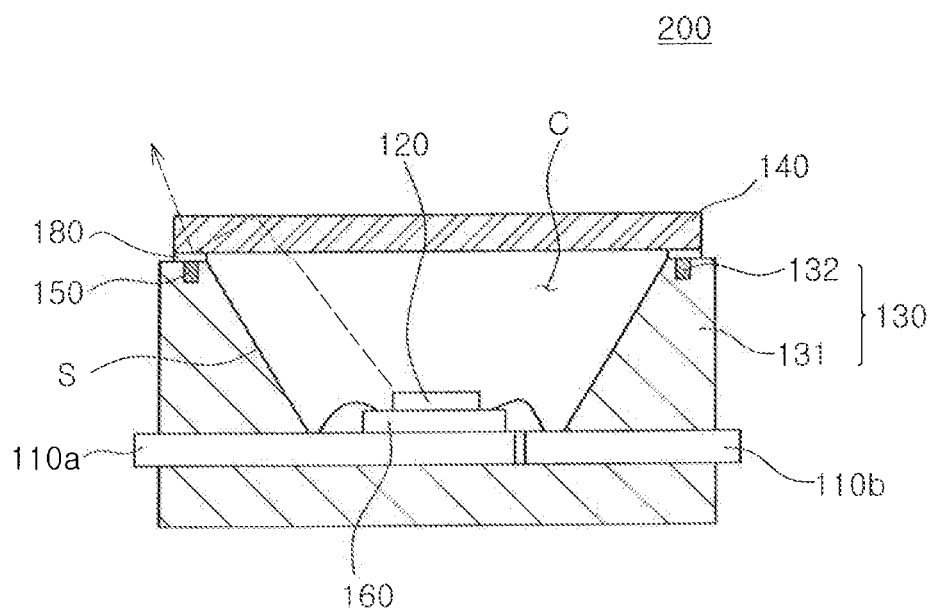
FIG. 4 is a schematic cross-sectional view of a light emitting apparatus according to another modification of the embodiment of the present inventive concept.

FIG. 4 is a schematic cross-sectional view of a light emitting apparatus according to another modification of the previously described embodiments.

Referring to FIG. 4, a light emitting apparatus 200 according to this embodiment may include at least one pair of lead frames 110*a* and 110*b*; a light emitting device 120 electrically connected to the at least one pair of lead frames 110*a* and 110*b* to emit ultraviolet rays; a body 130 surrounding the light emitting device 120; and a lens part 140 disposed above the light emitting device 120.

The body 130 may have a side wall 131 surrounding the light emitting device 120 and a groove portion 132 formed in an upper surface of the side wall 131 to receive an adhesive 150. The lens part 140 may be fixed to the upper surface of the side wall 131 of the body 130 by the adhesive 150.

In the present embodiment, an ultraviolet light reflecting part 180 may be further formed on one surface of the lens part 140, unlike the embodiment shown in FIG. 1, and hereinafter, only different features will be described.

The ultraviolet light reflecting part 180 may be formed by depositing or plating a high-reflective metal material, such as Ag, Ni, Al, Rh, Pd, Ir, Mg, Zn, Pt, Au, or the like, on one surface of the lens part 140. The ultraviolet light reflecting part 180 may be formed on a surface of the lens part 140, which contacts the upper surface of the body 131, and may be disposed to cover the groove portion 132 at a position corresponding to the groove portion 132.

As indicated by an arrow in FIG. 4, the ultraviolet light reflecting part 180 may allow light that is totally reflected from a surface of the lens part 140 to be incident toward the adhesive 150 to be reflected upwardly. Therefore, the light emitting apparatus according to the present embodiment can effectively prevent the ultraviolet rays emitted from the light emitting device 120 from reacting with the adhesive 150 in the concave portion C of the body 130 and also prevent the adhesive 150 from reacting with the light totally reflected in the lens part 140.

Figure 5:
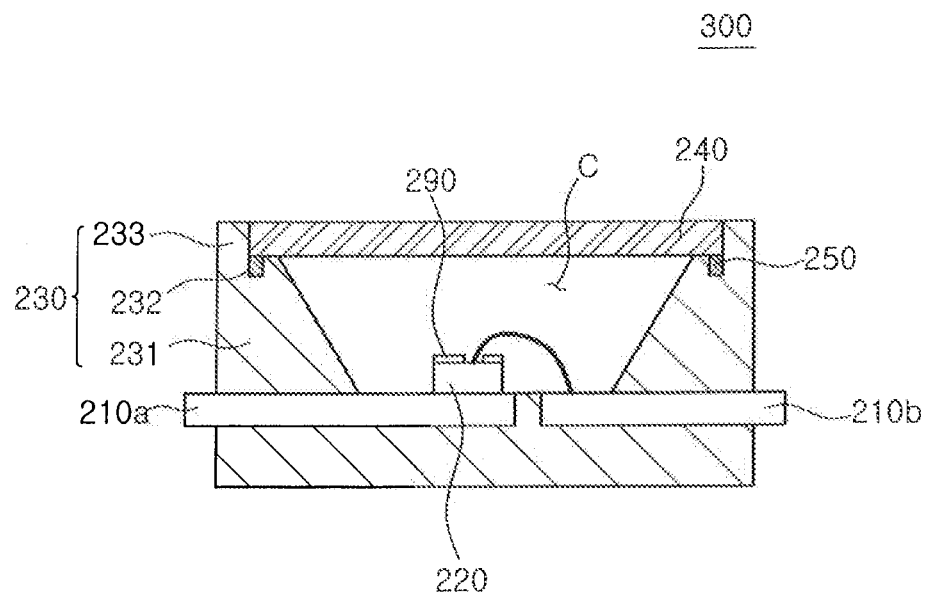
FIG. 5 is a schematic cross-sectional view of a light emitting apparatus according to another modification of the embodiment of the present inventive concept.

FIG. 5 is a schematic cross-sectional view of a light emitting apparatus according to another modified exemplary embodiment.

A light emitting apparatus 300 according to the present embodiment may include at least one pair of lead frames 210*a* and 210*b*; a light emitting device 220 electrically connected to the at least one pair of lead frames 210*a* and 210*b* to emit ultraviolet rays; a body 230 surrounding the light emitting device 220; and a lens part 240 disposed above the light emitting device 220.

The body 230 may have a side wall 231 surrounding the light emitting device 220 and a groove portion 232 formed in an upper surface of the side wall 231 to receive an adhesive 250. The lens part 240 may be fixed to the upper surface of the side wall 231 of the body 230 by the adhesive 250.

In the present embodiment, unlike the embodiment shown in FIG. 1, the light emitting device 220 may be disposed directly on the lead frames 210*a* and 210*b* and connected therewith using wires, and a wavelength conversion layer 290 may be formed on one surface of the light emitting device 220. In addition, the body 230 may further include a support part 233 formed on the upper surface of the side wall 231. However, it will be obvious to those skilled in the art that the method of mounting the light emitting device 220 and the shape of the body 230 do not necessarily have a relationship with each other, and may be separately applied as necessary. Hereinafter, only the different features will be described.

The light emitting device 220 may be disposed one of the pair of lead frames 210*a* and 210*b* while the light emitting device 220 is directly connected to one lead frame 210*a* and is connected to the other lead frame 210*b* through a wire. In this case, the lead frame 210*a* on which the light emitting device 220 is disposed may function as a heat radiating unit. Alternatively, the light emitting device 220 may be connected to both the pair of lead frames 210*a* and 210*b* through wires, or may be mounted in a flip chip manner without wires.

The wavelength conversion layer 290 for wavelength-converting the ultraviolet rays emitted from the light emitting device 220 may be formed on a light emitting surface of the light emitting device 220, and thus, the ultraviolet rays may be converted into various wavelengths of light. The wavelength conversion layer 290 may include phosphor particles for wavelength conversion of the ultraviolet rays. The phosphor particle may convert a wavelength of light into any one of yellow, red, and green light, and may include any one of YAG based, TAG based, Silicate based, Sulfide based, and Nitride based phosphor materials.

Meanwhile, alternatively to the present embodiment as described, the wavelength conversion layer 290 may be formed on one surface of the lens part 240, and in this case, the wavelength conversion layer 290 may wavelength-convert the light emitted from the light emitting device 220 and passing through the lens part 240, to thereby emit various colors of light.

The support part 233, upwardly protruding from the upper surface of the side wall 231 and disposed adjacently to an outer peripheral surface of the lens part 240, may be further formed on the upper surface of the side wall 231 of the body 230. The support part 233 may be formed as a ring along the outer peripheral surface of the lens part 240 to support or fix the lens part 240, but is not limited thereto. A single support part or a plurality of support parts may be formed on the upper surface of the side wall 231 at predetermined position(s).

The support part 233 may be formed integrally with the side wall 231, and the upper surface of the side wall 232 and the upper surface of the support part 233 may form a step structure. In the present embodiment, the position at which the lens part 240 is disposed may be more precisely controlled by the support part 233, and the combining strength between the lens part 240 and the body 230 may be enhanced, so that optical and mechanical reliability may be improved.

Figure 6:
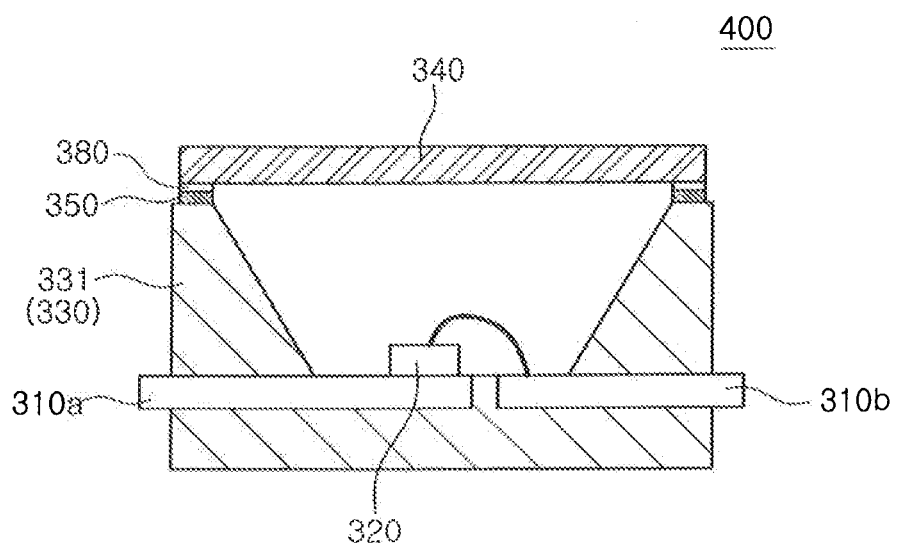
FIG. 6 is a schematic cross-sectional view of a light emitting apparatus according to another embodiment of the present inventive concept.

FIG. 6 is a schematic cross-sectional view of a light emitting apparatus according to yet another exemplary embodiment of the present inventive concept.

A light emitting apparatus 400 according to the embodiment of FIG. 6 may include at least one pair of lead frames 310*a* and 310*b*; a light emitting device 320 electrically connected to the at least one pair of lead frames 310*a* and 310*b* to emit ultraviolet rays; a body 330 surrounding the light emitting device 320; and a lens part 340 disposed above the light emitting device 320.

The lens part 340 may include an ultraviolet light reflecting part 380 formed on one surface of the lens part 340, and may be fixed to an upper surface of the side wall 331 of the body 330 by a eutectic alloy 350 interposed between the ultraviolet light reflecting part 380 and the upper surface of the side wall 331 of the body 330.

The light emitting apparatus 400 according to the present embodiment does not have a separate groove portion to receive an adhesive therein in the upper surface of the side wall of the body, and the lens part 340 may be fixed to the upper surface of the side wall 331 of the body by eutectic bonding using the eutectic alloy 350.

As the eutectic alloy 350, a eutectic metal including gold (Au), such as AuZb, AuGe, AuSn, AuAl, or the like, may be employed. Eutectic alloys including gold (Au), in the case in which the content of gold (Au) is 70-80%, may have excellent heat conductivity and reflectance and achieve bonding between the lens part 340 and the body 330 at a relatively low temperature through eutectic melting.

In addition, when the eutectic alloy 350 is used as an adhesive material, it may not be deteriorated by the ultraviolet rays, and thus, a separate groove portion for receiving the adhesive therein in the upper surface of the side wall 331 of the body 330 does not need to be prepared.

The ultraviolet light reflecting part 380 may be formed by depositing or plating a high-reflective metal material, such as Ag, Ni, Al, Rh, Pd, Ir, Mg, Zn, Pt, Au, or the like, on one surface of the lens part 340. In this case, the ultraviolet light reflecting part 380 can reflect the light that is totally reflected in the lens part 340 upwardly and enhance the bonding strength of the lens part 340 by the eutectic alloy 350 applied to the upper surface of the side wall 330.

As set forth above, according to the various exemplary embodiments of the present inventive concept, a light emitting apparatus having improved reliability can be provided.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting apparatus comprising:
    at least one pair of lead frames;
    a light emitting device electrically connected to the lead frames to emit ultraviolet rays;
    a body including a side wall surrounding the light emitting device, and a groove portion formed in an upper surface of the side wall to receive an adhesive; and
    a lens part disposed above the light emitting device and fixed to the upper surface of the side wall of the body by the adhesive such that the adhesive is sealed within the groove portion by the lens part and the side wall to prevent the adhesive from being exposed to the emitted ultraviolet rays.

2. The light emitting apparatus of claim 1, further comprising:
    an ultraviolet light reflecting part formed on a bottom surface of the lens part.

3. The light emitting apparatus of claim 2, wherein the lens part is disposed to allow the ultraviolet light reflecting part to cover the groove portion.

4. The light emitting apparatus of claim 2, wherein the ultraviolet light reflecting part includes at least one of silver (Ag), nickel (Ni), aluminum (Al), rhodium (Rh), palladium (Pd), iridium (Ir), magnesium (Mg), zinc (Zn), platinum (Pt), and gold (Au).

5. The light emitting apparatus of claim 1, wherein the groove portion is formed in the upper surface of the side wall as a ring.

6. The light emitting apparatus of claim 1, wherein the groove portion is provided in plural.

7. The light emitting apparatus of claim 1, wherein the body has a concave portion surrounded by the side wall to expose at least a portion of the lead frames on a bottom surface thereof, and
    the lens part is disposed to seal the concave portion.

8. The light emitting apparatus of claim 7, wherein the groove portion is formed in the upper surface of the side wall along an outer periphery of the concave portion.

9. The light emitting apparatus of claim 7, further comprising:
    an inert gas filling the concave portion.

10. The light emitting apparatus of claim 9, wherein the inert gas includes at least one of nitrogen ($N_2$), argon (Ar), and helium (He).

11. The light emitting apparatus of claim 7, wherein the concave portion is maintained in a vacuum state.

12. The light emitting apparatus of claim 1, wherein the side wall includes at least one surface having a slope structure in order to allow light emitted from the light emitting device to be reflected upwardly.

13. The light emitting apparatus of claim 1, further comprising:
    a reflective metal layer formed on at least one surface of the side wall to upwardly reflect the light emitted from the light emitting device.

14. The light emitting apparatus of claim 1, wherein the body further includes a support part protruding upwardly from the upper surface of the side wall and disposed adjacent to an outer peripheral surface of the lens part.

15. The light emitting apparatus of claim 14, wherein the support part is formed integrally with the side wall.

16. The light emitting apparatus of claim 1, further comprising:
    a sub-mount disposed on the lead frames, the light emitting device being disposed on the sub-mount.

* * * * *